(12) United States Patent
Chakravarti et al.

(10) Patent No.: US 7,001,844 B2
(45) Date of Patent: Feb. 21, 2006

(54) MATERIAL FOR CONTACT ETCH LAYER TO ENHANCE DEVICE PERFORMANCE

(75) Inventors: Ashima B. Chakravarti, Hopewell Junction, NY (US); Shreesh Narasimha, Beacon, NY (US); Victor Chan, New Paltz, NY (US); Judson Holt, Poughkeepsie, NY (US); Satya N. Chakravarti, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 10/835,949

(22) Filed: Apr. 30, 2004

(65) Prior Publication Data

US 2005/0245081 A1    Nov. 3, 2005

(51) Int. Cl.
*H01L 21/469*    (2006.01)
(52) U.S. Cl. .................. 438/680; 438/789; 438/790; 438/793; 438/794
(58) Field of Classification Search ........... 438/789, 438/790, 793, 794, 680
See application file for complete search history.

(56) References Cited

U.S. PATENT DOCUMENTS

| | | | |
|---|---|---|---|
| 5,874,368 A | 2/1999 | Laxman et al. | |
| 6,046,494 A | 4/2000 | Brigham et al. | |
| 6,153,261 A | 11/2000 | Xia et al. | |
| 6,268,299 B1 | 7/2001 | Jammy et al. | |
| 6,500,772 B1 * | 12/2002 | Chakravarti et al. | 438/789 |
| 6,573,172 B1 | 6/2003 | En et al. | |
| 6,586,814 B1 | 7/2003 | Patel et al. | |
| 6,812,073 B1 * | 11/2004 | Bu et al. | 438/151 |
| 2001/0000476 A1 | 4/2001 | Xia et al. | |
| 2001/0034129 A1 | 10/2001 | Moore et al. | |
| 2002/0063292 A1 | 5/2002 | Armstrong et al. | |
| 2002/0090835 A1 | 7/2002 | Chakravarti et al. | |
| 2002/0111039 A1 | 8/2002 | Moore | |
| 2002/0127763 A1 | 9/2002 | Arafa et al. | |
| 2002/0179908 A1 | 12/2002 | Arao | |
| 2003/0040158 A1 | 2/2003 | Saitoh | |
| 2003/0059535 A1 | 3/2003 | Luo et al. | |
| 2003/0068855 A1 | 4/2003 | Moore | |
| 2003/0127697 A1 | 7/2003 | Ohta et al. | |

FOREIGN PATENT DOCUMENTS

| | | |
|---|---|---|
| JP | 2001230248 A | 11/2002 |
| JP | 2003051452 A | 2/2003 |

* cited by examiner

*Primary Examiner*—David Nelms
*Assistant Examiner*—Renee R. Berry
(74) *Attorney, Agent, or Firm*—Whitham, Curtis & Christofferson, P.C.; Jay H. Anderson

(57) ABSTRACT

Stress level of a nitride film is adjusted as a function of two or more of the following: identity of a starting material precursor used to make the nitride film; identity of a nitrogen-containing precursor with which is treated the starting material precursor; ratio of the starting material precursor to the nitrogen-containing precursor; a set of CVD conditions under which the film is grown; and/or a thickness to which the film is grown. A rapid thermal chemical vapor deposition (RTCVD) film produced by reacting a compound containing silicon, nitrogen and carbon (such as bis-tertiary butyl amino silane (BTBAS)) with $NH_3$ can provide advantageous properties, such as high stress and excellent performance in an etch-stop application. An ammonia-treated BTBAS film is particularly excellent in providing a high-stress property, and further having maintainability of that high-stress property over repeated annealing.

35 Claims, 7 Drawing Sheets

MATERIAL FOR CONTACT ETCH LAYER TO ENHANCE DEVICE PERFORMANCE

BACKGROUND OF THE INVENTION

1. Field of the Invention

The present invention generally relates to integrated circuit manufacture, and more particularly to thin films and their production and their uses in conferring advantages upon the semiconductor devices being manufactured, especially in rapid thermal chemical vapor deposition (RTCVD) processes.

2. Background Description

Conventionally, various films have been produced for use in circuit manufacture (such as making transistors), in a variety of types of chemical vapor deposition (CVD) processes. Examples of the various CVD processes are low pressure chemical vapor deposition (LPCVD), plasma-enhanced chemical vapor deposition (PECVD), high density plasma chemical vapor deposition (HDPCVD), rapid thermal chemical vapor deposition (RTCVD), cyclic deposition (CLD), atomic layer deposition (ALD), and mixed deposition (MLD) (i.e., a mixture of CLD and ALD); etc. The respective deposition processes differ significantly from each other as to their conditions (temperature, pressure, flow, etc.), equipment, parameters (substrate, time, etc.) and other variables.

Across these different kinds of deposition processes, different film production methods and films have been disclosed.

As an example films produced in LPCVD processes, U.S. Pat. No. 5,874,368 (Feb. 23, 1999) discloses formation of silicon nitrides from bis-tertiary butyl amino silane (BTBAS), in an LPCVD furnace, with pressure in a range of 20 mTorr to 2 Torr and a temperature range of 500–800° C. Also see Laxman et al., "A low-temperature solution for silicon nitride deposition," Solid State Technology, April 2000, 79, disclosing LPCVD at 550–600° C.

U.S. Pat. No. 6,046,494 (Apr. 4, 2000) discloses forming an insulating layer in a semiconductor device at a relatively low temperature and without plasma for lower negative bias temperature instability and reduced dopant segregation. Methods are described for how to make a silicon nitride liner in a LPCVD furnace. For making the nitride layer, a chlorinated silane gas is used.

Another deposition that takes place during LPCVD, in an LPCVD batch furnace, is that of U.S. Pat. No. 6,268,299 (Jul. 31, 2001) disclosing formation of silicon-rich silicon nitride films used for barrier application. The silicon nitride films are deposited using various silicon containing precursors, e.g., bis-tertiary butyl amino silane (BTBAS), HCD, $SiH_4$, etc., and $NH_3$. The silicon to nitrogen ratio is modulated by changing the flow ratio of the silicon-containing precursor and $NH_3$.

U.S. Pat. No. 6,268,299 (Jul. 31, 2001) discloses a low temperature process for depositing barrier nitrides using $SiH_4$, dichlorosilane (DCS), BTBAS, HCD and mixtures of these gases in an LPCVD process. The flow ratio of $NH_3$ to the precursors was varied to give different Si:N ratios.

Japanese Patent 2003051452 (Feb. 21, 2003) discloses BTBAS nitride deposition by an LPCVD furnace. Film thickness accuracy is said to be improved by optimizing the cleaning process.

Another film produced using an LPCVD furnace is that of JP 2001230248A (Nov. 26, 2002), disclosing BTBAS nitride deposition using an LPCVD furnace.

LPCVD, of course, is but one known class of CVD processes. Other manufacturing processes include PECVD and HDPCVD processes.

As an example of films made during PECVD and HDPCVD processes, see, for example, U.S. Pat. App. 2002/0090835 A1 (Jul. 11, 2002), by some of the same inventors as the present invention, disclosing formation of nitride films by BTBAS and related compounds with plasma energy, to give carbon incorporation, with particular suitability for PECVD and HDPCVD processes.

Other deposition processes include CLD, ALD and MLD. As an example of films made by CLD, ALD and MLD processes, see, e.g., U.S. Pat. App. 2003/0059535 A1 (Mar. 27, 2003). Deposition by CLD, ALD and MLD is disclosed for silicon nitride and other materials, using a variety of precursors. The reactions are carried out in cold-wall reactors.

Another category of deposition is that of RTCVD. Some films have been produced in RTCVD processes. For example, U.S. Pat. No. 6,153,261 (Nov. 28, 2000) discloses deposition of silicon nitride and oxide using BTBAS in an RTCVD process. See also U.S. Pat. App. 2001/0000476 A1 (Apr. 26, 2001).

U.S. Pat. No. 6,455,389 (Sep. 24, 2002) discloses an RTCVD process in which is formed a space layer that is a silicon nitride. Silane or dichloride silane is reacted with ammonia to form silicon nitride. Huang et al. describe an RTCVD process generally as having the temperature of the chamber is about 650 to 700° C. and the pressure of the chamber is about 200 to 600 torr, with the proceeding time of the RTCVD deposition process being about 2 to 4 minutes.

Nitride films are used in many different applications. However, the question of satisfying a particular application is multi-variate and may be relatively complicated. Turning, for example, to semiconductor devices, many different properties are important for advantageous functioning of a particular device. There are many competing considerations for manufacturing a particular device. A variety of different manufacturing techniques have been suggested, of which the following are only some examples.

For example, on the one hand, high carbon incorporation may be desired. U.S. Pat. App. 2001/0034129 A1 (Oct. 25, 2001) discloses an etching process for layers with high carbon concentration. The deposition uses TEOS, BTBAS, $CCl_4$, $CO_2$, etc. Spacers may be formed by CVD using BTBAS and $NH_3$.

U.S. Pat. App. 2002/0111039 (Aug. 15, 2002) discloses certain silicon oxynitride spacers with low dielectric constant formed by BTBAS and nitrogen containing gases, with stoichiometry and other properties controlled to give a varied wet etch rate. Carbon incorporation is taught, to improve dry etch rate resistance.

U.S. Pat. App. 2002/0127763 (Sep. 12, 2002) teaches formation of an L-shaped spacer by in-situ oxide-nitride-oxide deposition using BTBAS and $O_2$ and $NH_3$ by LPCVD. There is provided a low-cost alternative L-shaped spacer, said to be better for gap-fill for a subsequent dielectric film.

It may be desired during manufacture to protect a gate stack from corrosives, such as reactive ion etching (RIE), wet etch, etc., as in U.S. App. 2003/0068855 A1 (Apr. 10, 2003), disclosing deposition of a nucleation (seed) layer of nitride deposited on a gate stack, followed by a nitride layer deposited on the seed layer by BTBAS. The carbon of the BTBAS nitride is used to protect the gate stack from corrosives.

U.S. Pat. No. 6,586,814 discloses use of BTBAS nitride for STI formation, using the etch resistance property of BTBAS nitride to help erosion of STI fill.

U.S. Pat. App. 2003/0127697 A1 (Jul. 10, 2003) discloses that, to generate compression in the channel of a PFET, the active region of a plurality of transistors is divided for each gate electrode and a thin STI is formed between adjacent gate electrodes.

In the case of semiconductor transistors, another property which has received some discussion is that of stress. For example, U.S. Pat. App. 2002/0063292 A1, discloses certain wafer orientation to generate local stress in the channel, and generally mentions a high-tensile nitride dielectric, but without specifically disclosing what measured value is meant by high-tensile or what specific nitride is an example of a high-tensile nitride.

U.S. Pat. App. 2002/0179908 A1 (Dec. 5, 2002) teaches various ways of introducing impurities, and controls internal stress of wiring in a thin film transistor (TFT) by introducing impurities and annealing.

U.S. Pat. No. 6,573,172 (Jun. 3, 2003) discloses formation of PECVD nitride films with different stress levels, on PMOS and NMOS devices.

Of course, optimizing any one property (such as a stress-related property) for a semiconductor device still must be balanced with satisfying many other necessary properties and performance considerations.

Also by way of background, in circuit manufacture, there has been used an assembly such as that shown in FIG. 1, in which, during wafer fabrication, a nitride liner 1 (such as a nitride film) covers a device 2 having a device active layer 21. Different types of nitride film conventionally have been available for wafer fabrication, providing different types of stress. Novellus plasma enhanced chemical vapor deposition (PECVD), Applied PECVD, and Applied Materials rapid thermal chemical vapor deposition (RTCVD) tools can provide Tensile Nitride films, and the stress is usually up to +10 G dynes/cm$^2$, with some examples according to conventional products being: Novellus, +2.5 G dynes/cm$^2$; PECVD, +4.5 G dynes/cm$^2$; RTCVD SiH$_4$, +9.8 G dynes/cm$^2$.

As another example of a nitride liner, see U.S. Pat. App. 2003/0040158 A1, in which are disclosed two separate liners with different stress to improve mobility. One liner is made by LPCVD and the other liner is made by PECVD.

However, the conventional films and methods for producing nitride liners and other films have not necessarily provided all of the characteristics that may be desirable for field effect transistors (FETs) and other applications. For example, conventionally, nitride films used as a nitride liner have not been able to provide as much stress as would be desirable while balancing other needed characteristics. Nor are there adequately simple, feasible production methodologies for making films and semiconductor devices (such as FETs) to have desired characteristics.

SUMMARY OF THE INVENTION

The present inventors have especially considered that local mechanical stress (compressive or tensile stress) enhances the channel mobility and drive current in a field effect transistor (FET). Tensile stress in the nFET and compressive stress in the pFET can enhance the carrier mobility individually. Thus, the present invention has as an objective to provide a desirable stress for FET applications, such as a sufficiently high-stress (such as stress exceeding +10 G dynes/cm$^2$, such as, in a preferred example, stress of about +14.5 G dynes/cm$^2$) for an etch stop liner.

Moreover, the present invention also has an objective to provide a material that continues to exhibit the desired high-stress after repeated annealing.

The present inventors have determined that the stress provided by a film (e.g., an RTCVD nitride film) may be manipulated as a function of a combination of two or more of the following: a starting material precursor used to make the film (such as, e.g., a compound containing Si, C and N in any combination, preferably, BTBAS); a treating material with which is treated the starting material precursor (such as a nitrogen-containing precursor, preferably, a material suitable for forming a nitride film, most preferably, NH$_3$); a ratio of the starting material precursor to the treating material; CVD conditions under which the film is grown (such as, e.g., RTCVD conditions); and/or a thickness to which the film is grown.

It is a further object of the present invention to provide a method of producing a high-stress nitride film, comprising: reacting a compound comprising Si, N and C in any combination (with such a compound preferably being a non-chlorine compound), with NH$_3$, under rapid thermal chemical vapor deposition (RTCVD) conditions, plasma-enhanced chemical vapor deposition (PECVD) conditions or low pressure chemical vapor deposition (LPCVD) conditions, wherein from the reacting step is formed a high-stress film with a stress provision value exceeding +10 G dynes/cm$^2$. Some optional details for the above-mentioned method are as follows. In a preferred embodiment of such an inventive method, the reaction is carried out with a carbon concentration of 3 to 15 atomic %. The compound comprising Si, N and C preferably may be

$$(R-NH)_{4-n}SiX_n \qquad (I)$$

wherein R is an alkyl group (which may be the same or different), n is 1, 2 or 3, and X is H or halogen. A most preferable compound comprising Si, N and C is bis-tertiary butyl amino silane (BTBAS).

In another preferred embodiment, the present invention provides a process of producing a nitride film, comprising: reacting, under RTCVD conditions, PECVD conditions or LPCVD conditions, at a temperature in a range of about 500 to 700° C., at a pressure in a range of about 50 to 500 T, (A) a compound comprising Si, N and C in any combination, with (B) a nitrogen containing precursor (such as, e.g., NH$_3$.).

Further preferred embodiments of such inventive processes and methods are as follows. There may be further included, during the reacting step, addition of at least one chemical compound, such as, e.g., silane, disilane, hexachloro disilane and other silane-based compounds. There may from the reacting step be formed a film having a stress-provision value in an amount exceeding +10 G dynes/cm$^2$. The reacting step may be conducted at a temperature in a range of about 500 to 700° C. The reacting step may be conducted at a pressure in a range of about 50 to 500 T.

Another preferred embodiment of the invention provides a silicon nitride film, comprising a film with a high stress provision in an amount exceeding +10 G dynes/cm$^2$, such as, for example, a film comprising a reaction product of bis-tertiary butyl amino silane (BTBAS) and NH$_3$ (such as, e.g., a reaction product having a chemical structure of Si$_x$N$_y$C$_z$H$_w$, wherein x, y, z and w are each an integer or non-integer greater than zero); a film that is stress-providing in a range of about +14 to +18 G dynes/cm$^2$; etc.

The invention in a further preferred embodiment provides a method of semiconductor wafer manufacture, comprising: covering at least part of a device active layer with a silicon nitride liner having a tensile stress exceeding +10 G dynes/ $cm^2$ (preferably, tensile stress of at least +14.5 G dynes/ $cm^2$), such as, e.g., preferably, a silicon nitride liner comprising a nitride film which is a reaction product of BTBAS and $NH_3$. In one preferred embodiment of the inventive method of semiconductor manufacture, all of the device active layer is covered with the silicon nitride liner. The covering step may be, for example, during a RTCVD process or other CVD process.

The invention in yet another preferred embodiment provides a nitride liner formed by a RTCVD, PECVD, or LPCVD process. A preferred example of such an inventive liner is one comprising a nitride film which is a reaction product of, for example, BTBAS and $NH_3$. Another preferred example of an inventive liner is a liner wherein the nitride film has a tensile stress exceeding +10 G dynes/$cm^2$, such as, for example, a nitride liner wherein the nitride film has a tensile stress of at least +14.5 G dynes/$cm^2$. Another preferred example of an inventive liner is a nitride liner is an ammonia-treated BTBAS reaction product that maintains a relatively-high stress level after repeated annealing.

It also should be appreciated that the present invention in another preferred embodiment provides a method of adjusting a stress level of a nitride film, comprising adjusting at least two selected from the group consisting of: (1) a selection of a starting material precursor (such as, for example, a starting material precursor that is a compound containing Si, C and N in any combination, such as, preferably, BTBAS) used to make the nitride film; (2) a selection of a nitrogen-containing precursor (such as, preferably, $NH_3$) with which is treated the starting material precursor; (3) a ratio of the starting material precursor to the nitrogen-containing precursor; (4) a set of CVD conditions (such as RTCVD conditions, etc.) under which the film is grown; and (5) a thickness to which the film is grown (such as, e.g., thickness in a range of about 50 to 1,000 angstroms, etc.). In one preferred example, the CVD conditions are at a temperature in a range of about 500–700° C. at a pressure in a range of about 50 to 500 T for a time in a range of about 30 to 600 seconds. In a preferred embodiment, the inventive stress level adjustment method provides for the stress level of a nitride film to be adjusted to a range of +10 G to +18 G dynes/$cm^2$. In another preferred example, the nitride film is an ammonia-treated BTBAS film.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF CERTAIN PREFERRED EMBODIMENTS OF THE INVENTION

The present invention in a particularly preferred embodiment provides a method of adjusting a stress level of a film (such as, e.g., a nitride film), by manipulating two or more of the following:

a starting material precursor used to make the film (such as, e.g., a compound containing Si, C and N in any combination, of which a preferred example is BTBAS);

a nitrogen-containing precursor with which is treated the starting material precursor (with a preferred example of a nitrogen-containing precursor being a material suitable for forming a nitride film, most preferably, $NH_3$);

a ratio of the starting material precursor to the nitrogen-containing precursor;

a set of CVD conditions under which the film is grown (such as, e.g., RTCVD conditions, preferably, RTCVD conditions at a temperature in a range of about 500–700° C. at a pressure in a range of about 50–500 T for a time in a range of about 30–600 seconds; and/or a thickness to which the film is grown (such as, e.g., a thickness in a range of about 50 to 1,000 Angstroms.

In a preferred example according to the present inventive method of adjusting a stress level of a film, the starting material precursor used to make the film and the nitrogen-containing precursor are selected to form a nitride film, with a particularly preferred combination being a reaction of BTBAS precursor with $NH_3$ gas to form a nitride film. A nitride film formed from ammonia-treated BTBAS may be manipulated to have a high stress level (e.g., a stress level exceeding +10 G dynes/$cm^2$) with a particular value for stress level within a range of about +10 G dynes/$cm^2$ to +18 G dynes/$cm^2$ being selectable as desired by manipulation of one or more of the remaining manipulation factors, i.e., the ratio of the starting material precursor to the nitrogen-containing precursor; the set of CVD conditions under which the film is grown; and/or the thickness to which the film is grown.

Figure 1:
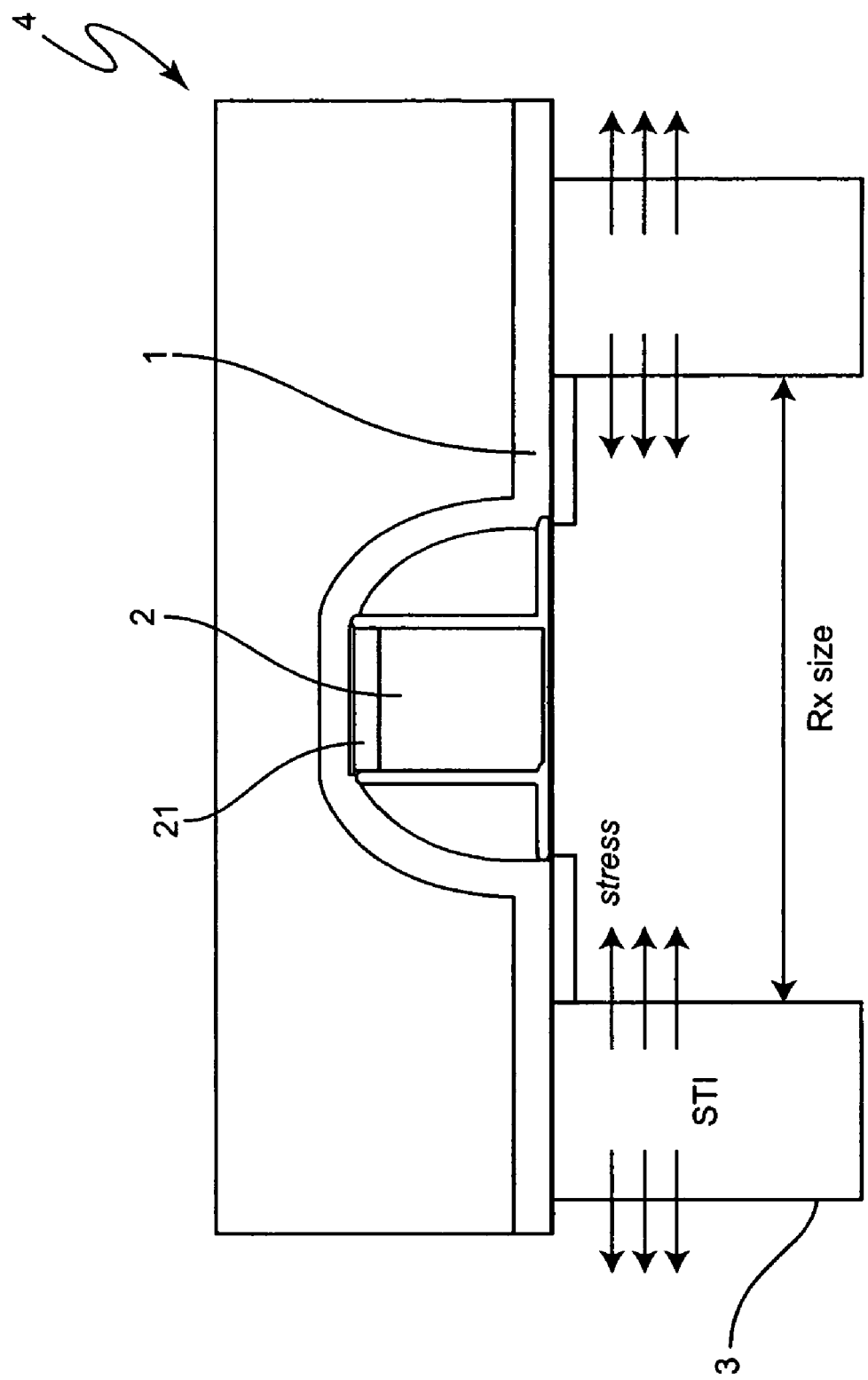
FIG. 1 is a conventional assembly including a nitride liner covering a device active layer.
Figure 2:
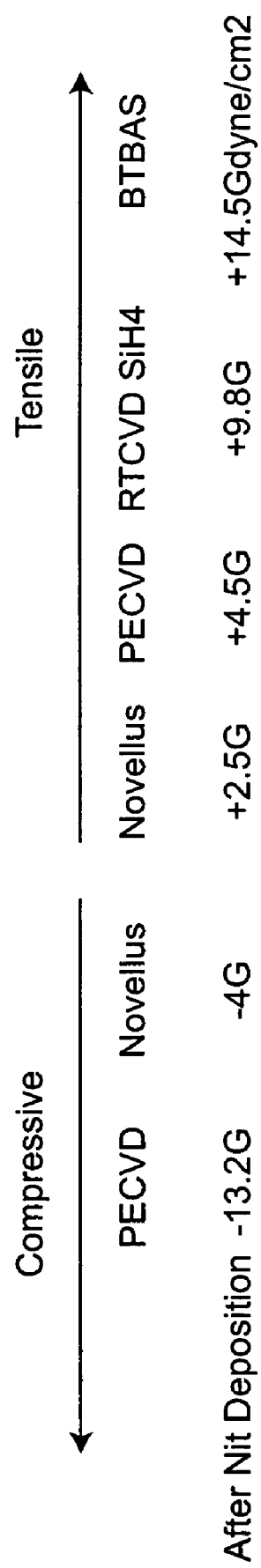
FIG. 2 is a chart showing compressive and tensile stress, for films after nitride deposition, including conventional films and a film (BTBAS) according to the present invention.

The example of a nitride film is further discussed with reference to FIG. 1, showing an exemplary wafer fabrication assembly 4, in which heavy mechanical stress can be produced by a nitride liner 1 (which may be a conventional nitride liner or a nitride liner according to the present invention) covering the active layer 21 of the device 2. The present invention provides superior performance (such as greater and/or different type of stress) compared to that provided by conventional examples of nitride films that have been available for wafer fabrication (such as use as liner 1 in an assembly 4). It will be appreciated that FIG. 1 is provided by way of illustration and the present invention should not be considered limited to an arrangement according to FIG. 1. In a wafer fabrication assembly (such as the assembly 4 of FIG. 1), the present invention advantageously provides stress that is greater and/or different than that provided by conventional tools (of which some examples are, e.g., Novellus PECVD, Applied PECVD, and Applied Materials RTCVD tools, which have provided Tensile Nitride films with stress usually up to about +10 G dynes/cm$^2$ for those conventional films, as shown in FIG. 2).

The present invention advantageously provides a film with relatively high tensile stress (such as, for example, tensile stress in excess of +10 G dynes/cm$^2$, such as, in a preferred example of about +14.5 G dynes/cm$^2$) than provided by the conventional nitride films. Also advantageously, unlike many conventional films, this stress provided by films according to the invention does not change significantly after subsequent anneals.

For producing an exemplary film according to the present invention, there may be used as a starting material a compound comprising Si, N and C in any combination, of which a preferred example is a bis-tertiary butyl amino silane (BTBAS) precursor. BTBAS is a commercially available reagent, and, advantageously, is a non-chlorine precursor.

In the present invention, the compound comprising Si, N and C (such as, e.g., BTBAS) is reacted with a suitable film-forming reagent such as, e.g., NH$_3$, preferably with NH$_3$ under conditions for nitride-film forming, most preferably with NH$_3$ under conditions for forming a nitride film of desired stress measurement (such as, e.g., stress exceeding +10 G dynes/cm$^2$, preferably, stress in a range of about +14 to +18 G dynes/cm$^2$) and/or other characteristics (such as maintainability of a stress characteristic through repeated annealing).

The reaction according to the present invention in which the compound comprising Si, N and C (such as, e.g, a BTBAS precursor) is used as a starting material may be conducted, e.g., under RTCVD conditions (most preferably, in a RTCVD tool, such as, for example, an Applied Material Centura RTCVD tool which is commercially available); under PECVD conditions; under LPCVD conditions, etc.

The invention provides high-stress-level films, such as, in a particularly preferred example, an RTCVD ammonia-treated BTBAS nitride film. The stress level of a film may be manipulated by the film thickness, such as by thickening the film (through increased amounts of the C, Si and N containing starting material (such as BTBAS) and the treating material (such as NH$_3$) or by increasing the deposition time to increase the stress level.

The films (such as nitride films) of the present invention may be used, for example, as an etch stop (barrier) nitride liner such as liner 1 in FIG. 1. It will be appreciated that FIG. 1 is exemplary and that a liner according to the present invention may be used in other configurations. Additionally, the films (such as nitride films) of the present invention may be used for a shallow trench isolation (STI) liner, a gate spacer, etc.

It will be appreciated that the present invention provides films superior in certain ways (such as provision of high tensile stress and/or low variability in stress data) compared to conventional PECVD films. Although conventionally many types of PECVD films have been used to produce some tensile stress, unfortunately most of those PECVD films cannot produce tensile stress as high as may be desired. The present invention provides, in a particularly preferred embodiment, an RTCVD BTBAS Nitride film which desirably can provide higher tensile stress, such as, e.g., stress exceeding +10 G dynes/cm$^2$, preferably, stress exceeding +10 G dynes/cm$^2$, such as stress in a range of about +14 to +18 G dynes/cm$^2$.

In addition, also beneficially, the invention provides a BTBAS Nitride film that has smaller variation in stress data than the PECVD films. On the other hand, the stress obtained from a BTBAS nitride film according to the present invention is extremely repeatable, and also is not influenced easily by process parameters. A BTBAS nitride film that withstands influence by process parameters is an advantage of the present invention.

In the present invention, films may be deposited in a thickness as desired, with a preferred range of film thickness being about 50 to 1,000 angstroms. The present invention further provides for variability of the film thickness for giving a desired stress level. For example, a nitride film thickness can be varied to provide different stress levels as desired. In setting the nitride thickness, the application (such as use as an etch-stop liner) is considered.

For example, for successfully using an inventive film (such as a BTBAS film) as an etch-stop liner, the spacer nitrides should be carefully selected with regard to thickness and stress, taking into account that the improvement in stress given by films according to the invention compared to conventional films is due to the exertion of tensile stress at the corner of the gate. That is, because the improvement is due to the exertion of tensile stress at the corner of the gate, if the spacer is too thick, or has too high a stress, the effect of the inventive film (such as a BTBAS film) would be minimized. Accordingly, the spacer nitrides should be selected so as not to be too thick or to provide too high a stress for the particular application, when an inventive film (such as a BTBAS film) is used as an etch-stop liner.

Inventive films (such as BTBAS films) have advantageous applications for tensile stress production, providing a spacer, and other applications known for RTCVD SiH$_4$ films or PECVD films for spacer formation. Advantageously, the present invention provides spacers (such as BTBAS spacers) that give better conformity and loading effect than conventional nitride films.

Some inventive examples are given below, without the invention being limited to such examples.

INVENTIVE EXAMPLE 1

A film (i.e., a nitride film) was deposited by reacting BTBAS and NH$_3$ in a single wafer reactor. A process condition is selected which gives a carbon concentration of 3 to 15 atomic %.

Figure 3:
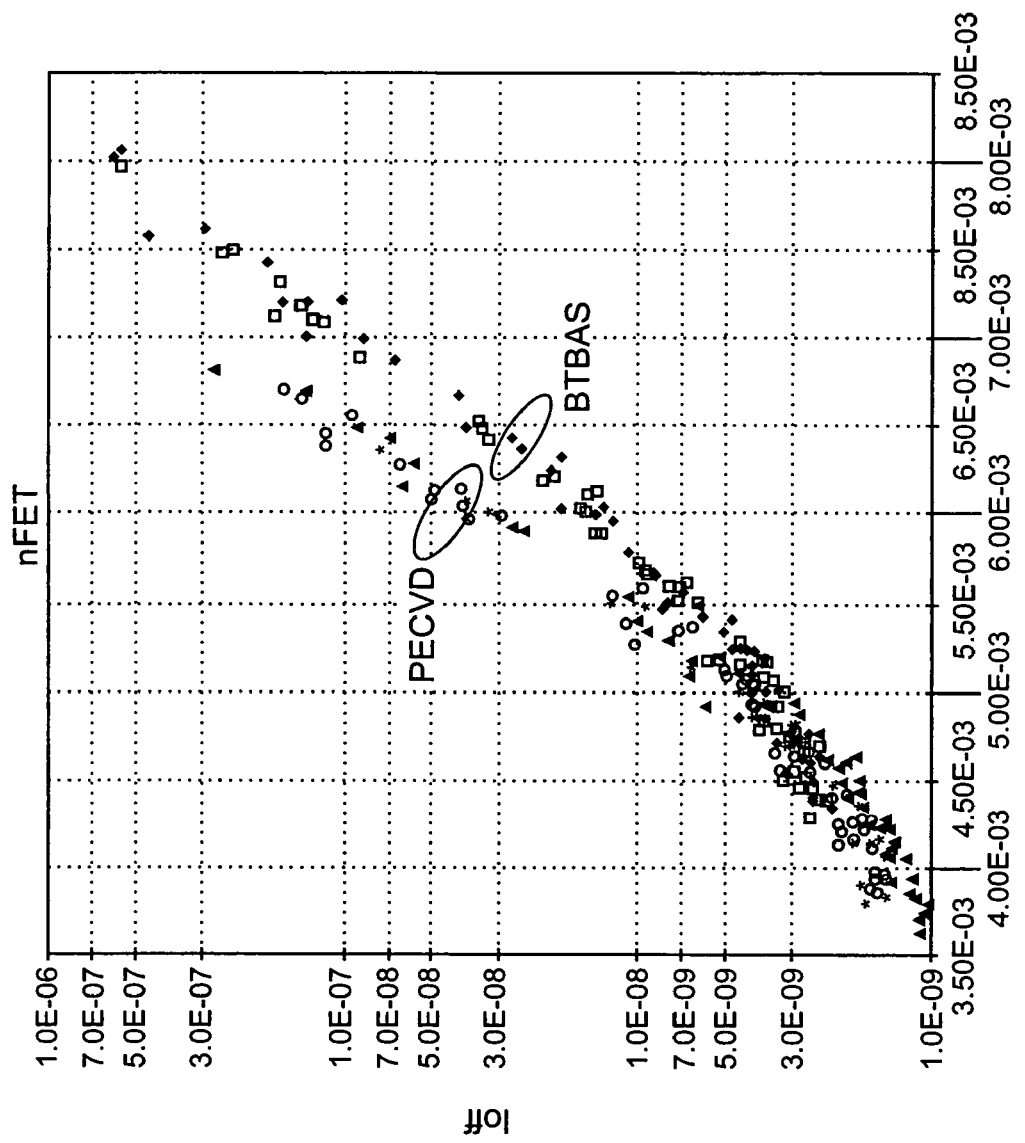
FIG. 3 are graphs of Ioff versus Ion for nFETs, including a conventional NFET according to a PECVD method and an inventive nFET (BTBAS).
Figure 4:
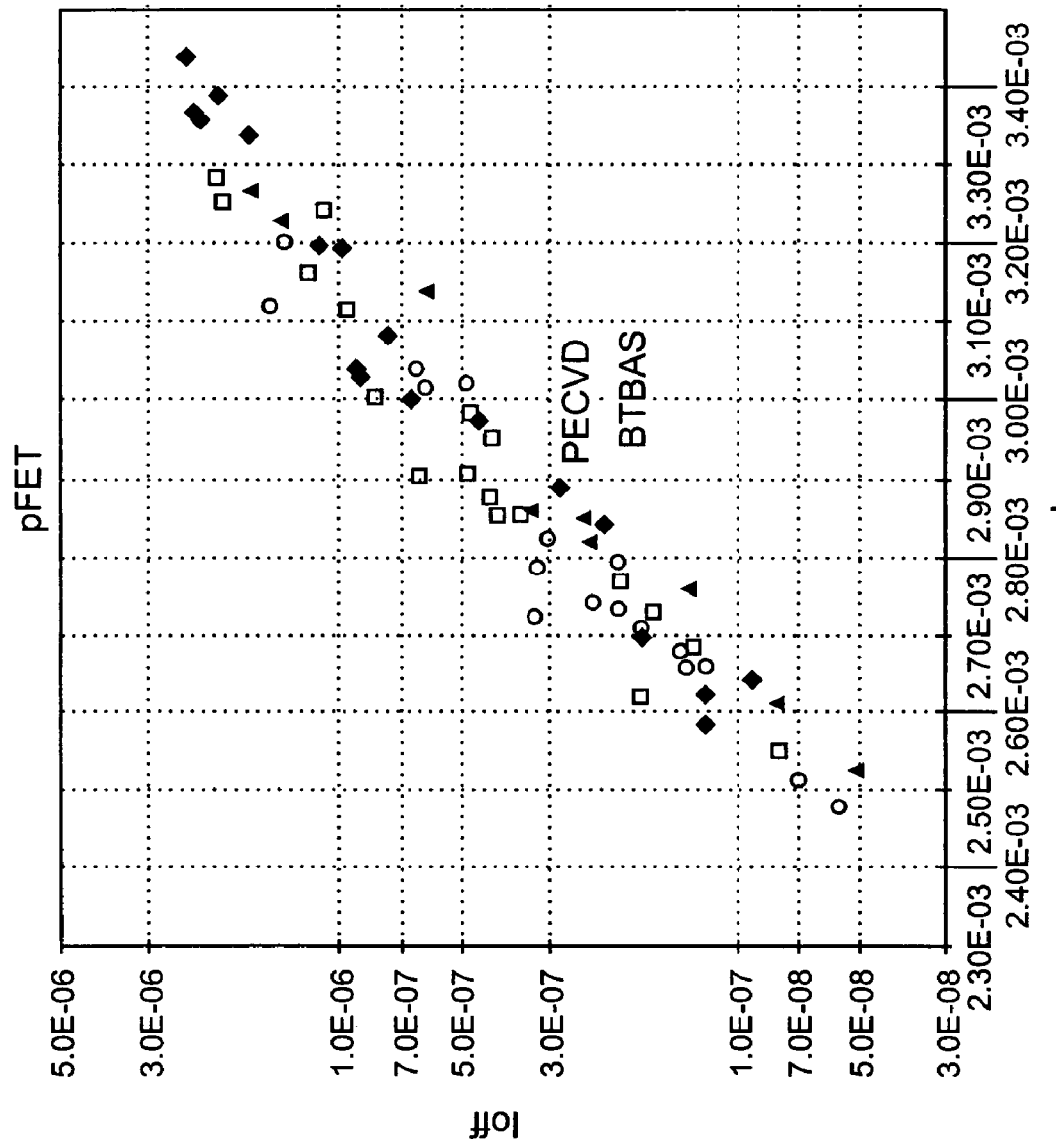
FIG. 4 are graphs of Ioff versus Ion for pFETs, including a conventional pFET according to a PECVD method and an inventive pFET (BTBAS).

Device data was obtained that shows the drive current improvement compared to conventional films. FIGS. 3 and 4 show the electrical characteristics of the nFET and pFET. BTBAS nitride film can provide higher NFET drive current compared with devices with PECVD Tensile Nit film (and PECVD Compressive Nit film). There is also no degradation on the pFET drive current, for the film according to the inventive example. The nFET drive current improvement is dependent on the local strain, hence the device geometry and nitride thickness. In general, for a long width nFET device, BTBAS with 500 A in thickness can provide 8% nFET current improvement, with 750 A BTBAS giving extra 3% current improvement. There is also no degradation on the pFET drive current.

Figure 5:
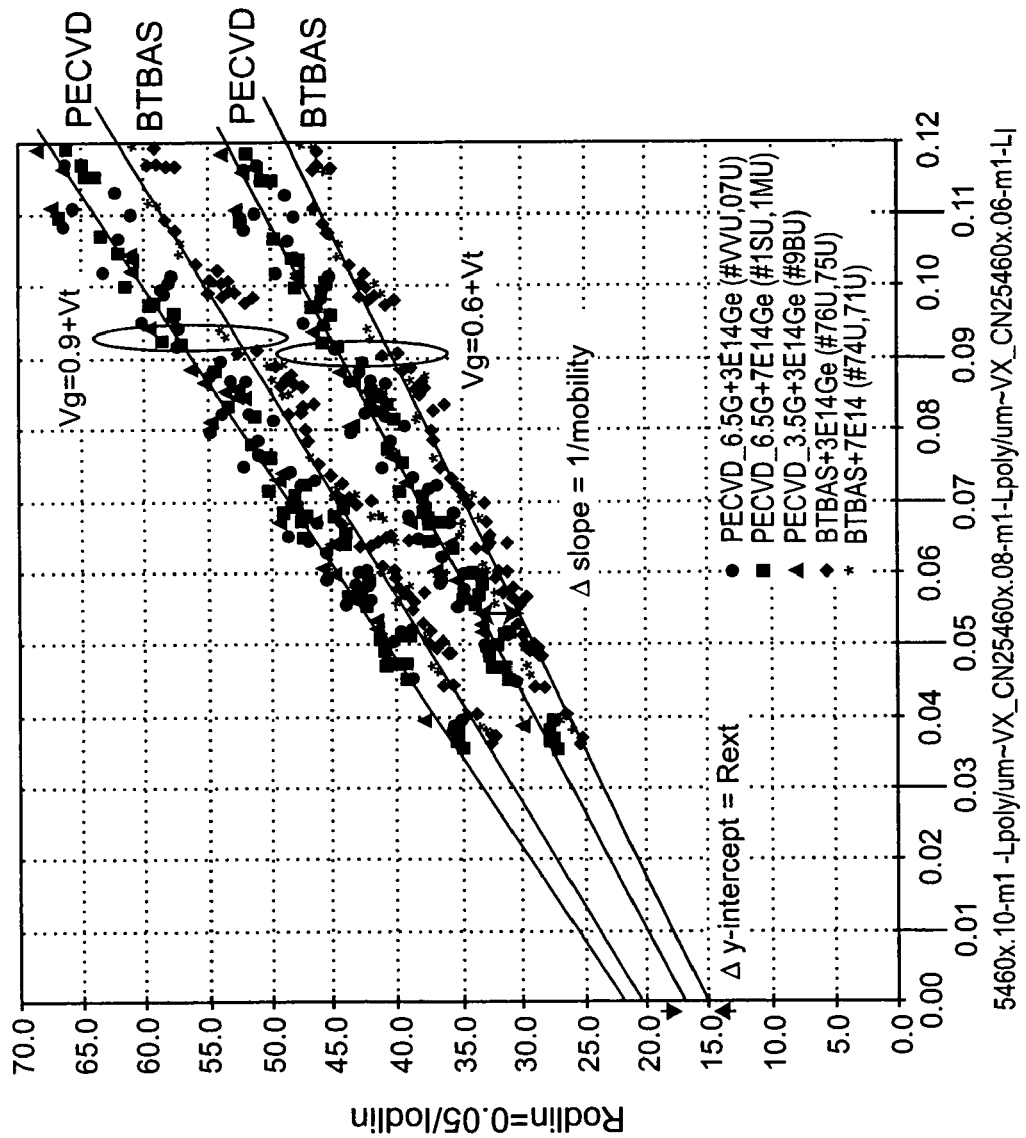
FIG. 5 are Iodlin data, showing the relationship between PECVD (conventional) and BTBAS (inventive) data.
Figure 6:
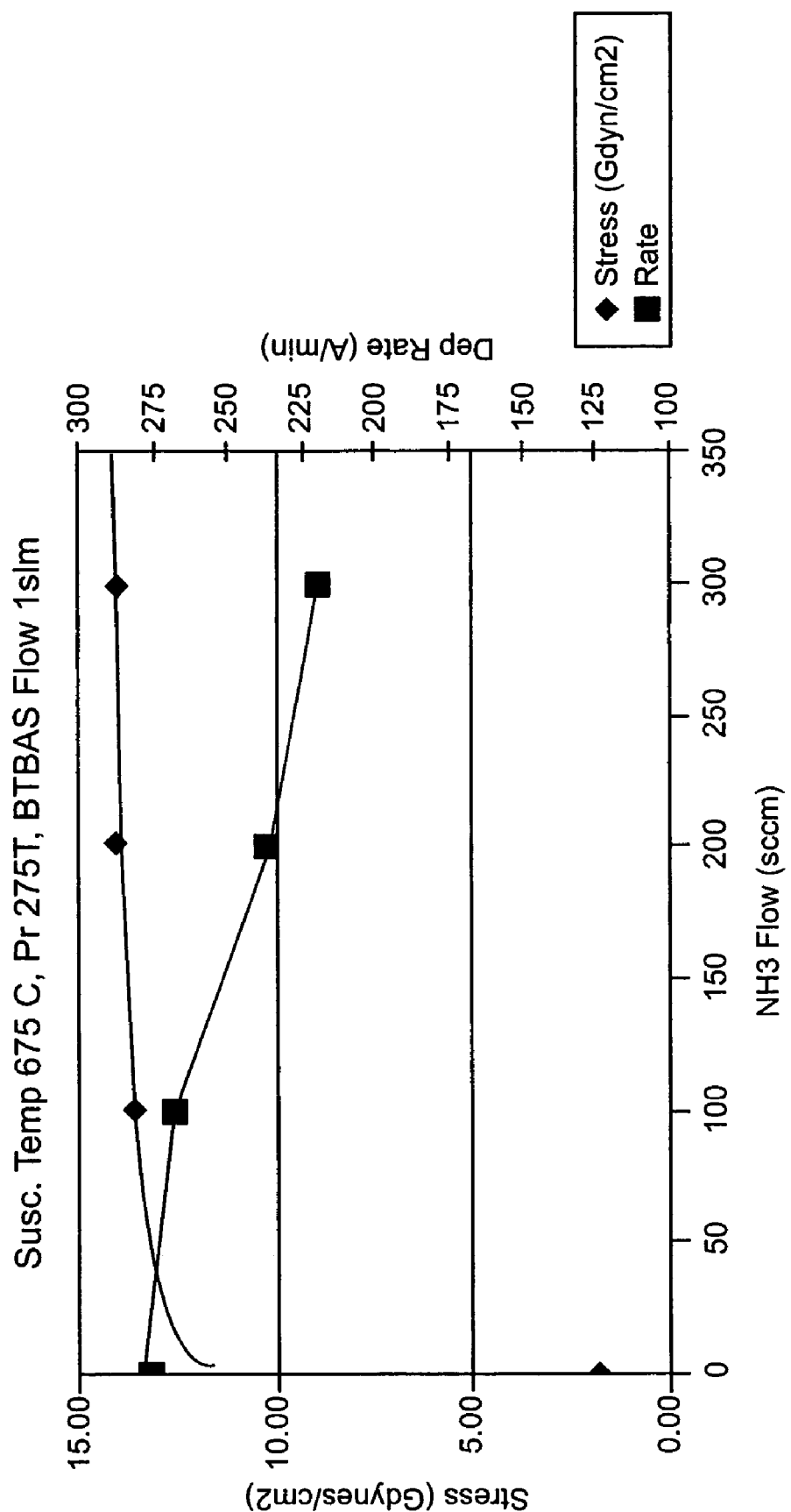
FIG. 6 is a graph for heater temperature 675° C., pressure 275 torr, BTBAS flow 1 slm. The diamond points show stress and the box points show rate. The x-axis is for ammonia flow (sccm); the left y-axis shows stress; the right y-axis shows deposition rate.
Figure 7:
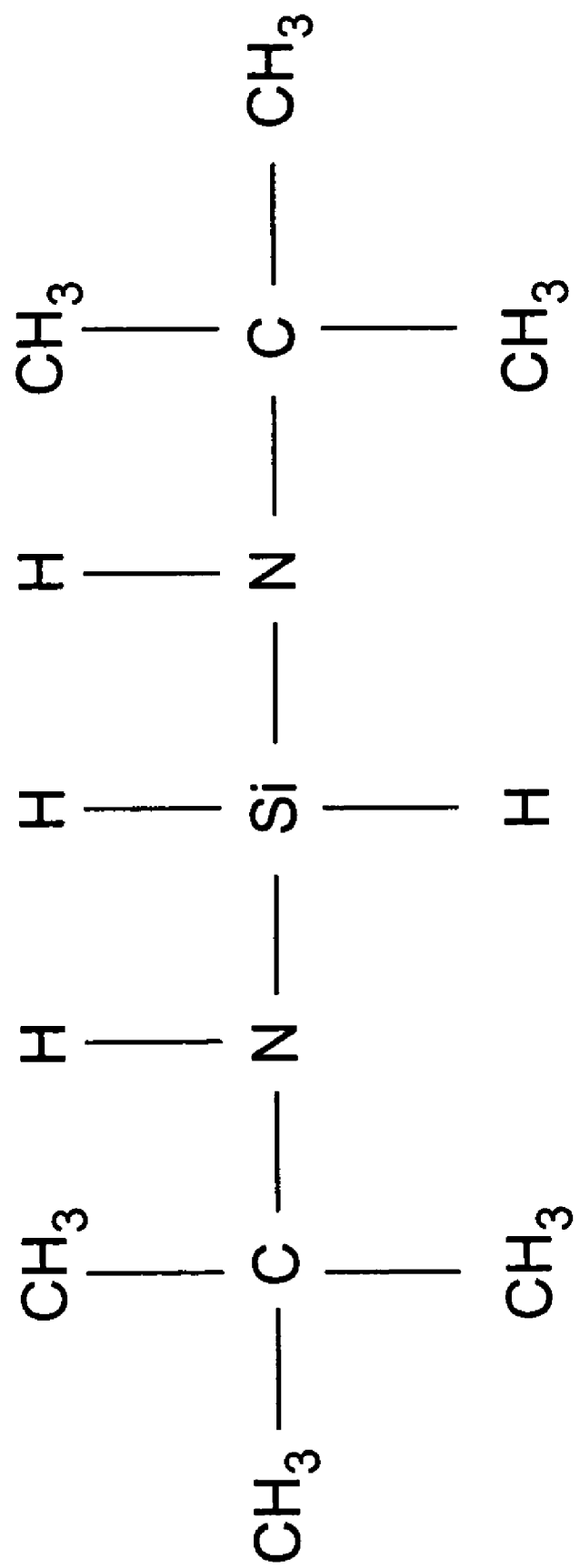
FIG. 7 is the chemical structure for bis-tertiary butyl amino silane (BTBAS).

The FIG. 5 Iodlin data suggests that the improvement of the nFET drive current is mainly due to better carrier mobility in the channel and the external resistance in the source and drain and under the spacer.

INVENTIVE EXAMPLE 2

In an RTCVD process, BTBAS and $NH_3$ are reacted, under the following conditions:

| | |
|---|---|
| Carbon concentration: | ~6 to 10% |
| Temperature | 650° C. |
| Pressure | 140 torr |
| Dilane, disilane, hexachloro disilane? | None |

Films of thickness 500 or 750 angstroms are formed. Other film thicknesses may be formed.

While the invention has been described in terms of its preferred embodiments, those skilled in the art will recognize that the invention can be practiced with modification within the spirit and scope of the appended claims.

We claim:

1. A method of producing a high-stress nitride film, comprising:
    reacting (A) a compound comprising Si, N and C in any combination, with (B) $NH_3$,
    under rapid thermal chemical vapor deposition (RTCVD) conditions, plasma-enhanced chemical vapor deposition (PECVD) conditions or low pressure chemical vapor deposition (LPCVD) conditions,
    wherein from the reacting step is formed a high-stress film with a stress provision value exceeding +10 G dynes/$cm^2$.

2. The method of claim 1, wherein the reacting step is under RTCVD conditions.

3. The method of claim 1, further including, during the step of reacting the Si, N and C containing compound with $NH_3$, addition of at least one chemical compound selected from the group consisting of: silane, disilane, hexachloro disilane and other silane-based compounds.

4. The method of claim 1, wherein the compound (A) is a non-chlorine compound.

5. The method of claim 1, wherein the compound comprising Si, N and C is

$$(R-NH)_{4-n}SiX_n \qquad (I)$$

wherein R is an alkyl group (which may be the same or different), n is 1, 2 or 3, and X is H or halogen.

6. The method of claim 1, wherein the compound (A) is bis-tertiary butyl amino silane (BTBAS).

7. The method of claim 1, wherein the reacting step is that of reacting bis-tertiary butyl amino silane (BTBAS) and $NH_3$.

8. The method according to claim 1, in which the reaction is carried out with a carbon concentration of 3 to 15 atomic %.

9. A process of producing a nitride film, comprising:
    reacting, under rapid thermal chemical vapor deposition (RTCVD) conditions, conditions, plasma-enhanced chemical vapor deposition (PECVD) conditions or low pressure chemical vapor deposition (LPCVD) conditions, at a temperature in a range of about 500 to 700° C., at a pressure in a range of about 50 to 500 T,
    (A) a compound comprising Si, N and C in any combination, with
    (B) a nitrogen containing precursor;
    wherein from the reacting step is formed a high-stress film with a stress provision value exceeding +10 G dynes/$cm^2$.

10. The process of claim 9, wherein the reacting step is under RTCVD conditions.

11. The process of claim 9, wherein the nitrogen containing precursor is $NH_3$.

12. The process of claim 9, wherein from the reacting step is formed a film having a stress-provision value in an amount exceeding +10 G dynes/$cm^2$.

13. The process of claim 9, wherein the reacting step is conducted at a temperature in a range of about 500 to 700° C.

14. The process of claim 9, wherein the reacting step is conducted at a pressure in a range of about 50 to 500 T.

15. The process of claim 9, wherein the film comprises a reaction product of bis-tertiary butyl amino silane (BTBAS) and $NH_3$.

16. The process of claim 9, wherein the reaction product has a chemical structure of $Si_xN_yC_zH_w$, wherein x, y, z and w are each an integer or non-integer greater than zero.

17. The process of claim 9, wherein the film is stress-providing in a range of about +14 to +18 G dynes/$cm^2$.

18. A method of semiconductor wafer manufacture, comprising:
    covering at least part of a device active layer with a silicon nitride liner having a tensile stress exceeding +10 G dynes/$cm^2$.

19. The method of claim 18, wherein the tensile stress of the silicon nitride liner is at least +14.5 G dynes/$cm^2$.

20. The method of claim 18, wherein the silicon nitride liner comprises a nitride film which is a reaction product of bis-tertiary butyl amino silane (BTBAS) and $NH_3$.

21. The method of claim 18, wherein all of the device active layer is covered with the silicon nitride liner.

22. The method of claim 18, wherein the covering step is during a rapid thermal chemical vapor deposition (RTCVD) process.

23. The method of claim 1, wherein a nitride liner is formed by a rapid thermal chemical vapor deposition (RTCVD), plasma-enhanced chemical vapor deposition (PECVD), or low pressure chemical vapor deposition (LPCVD) process, said liner comprising:
    a nitride film which is a reaction product of bis-tertiary butyl amino silane (BTBAS) and $NH_3$.

24. The method of claim 23, wherein the nitride film has a tensile stress of at least +14.5 G dynes/$cm^2$.

25. The method of claim 23, wherein the ammonia-treated BTBAS reaction product maintains a relatively-high stress level after repeated annealing.

26. A method of adjusting a stress level of a nitride film, comprising adjusting at least two selected from the group consisting of:
    a selection of a starting material precursor used to make the nitride film;
    a selection of a nitrogen-containing precursor with which is treated the starting material precursor;
    a ratio of the starting material precursor to the nitrogen-containing precursor;
    a set of CVD conditions under which the film is grown; and
    a thickness to which the film is grown.

27. The stress level adjustment method of claim 26, wherein the starting material precursor is a compound containing Si, C and N in any combination.

28. The stress level adjustment method of claim 26, wherein the starting material precursor is BTBAS.

29. The stress level adjustment method of claim 26, wherein the nitrogen-containing precursor is $NH_3$.

30. The stress level adjustment method of claim 26, wherein the CVD conditions are RTCVD conditions.

31. The stress level adjustment method of claim 30, wherein the RTCVD conditions are at a temperature in a range of about 500–700° C. at a pressure in a range of about 50 to 500 T for a time in a range of about 30 to 600 seconds.

32. The stress level adjustment method of claim 26, wherein the thickness is in a range of about 50 to 1,000 angstroms.

33. The stress level adjustment method of claim 26, wherein the stress level of a nitride film is adjusted to a range of +10 G to +18 G dynes/$cm^2$.

34. The stress level adjustment method of claim 33, wherein the nitride film is an ammonia-treated BTBAS film.

35. The process of claim 10, wherein BTBAS is reacted with $NH_3$, at a carbon concentration of about 6 to 10%, at a temperature of 650° C., at a pressure of 140 torr.

* * * * *